US009378844B2

(12) United States Patent
Takahashi

(10) Patent No.: US 9,378,844 B2
(45) Date of Patent: Jun. 28, 2016

(54) SEMICONDUCTOR DEVICE INCLUDING TRANSISTOR WHOSE GATE IS ELECTRICALLY CONNECTED TO CAPACITOR

(71) Applicant: SEMICONDUCTOR ENERGY LABORATORY CO., LTD., Atsugi-shi, Kanagawa-ken (JP)

(72) Inventor: Kei Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 27 days.

(21) Appl. No.: 14/445,311

(22) Filed: Jul. 29, 2014

(65) Prior Publication Data
US 2015/0034948 A1 Feb. 5, 2015

(30) Foreign Application Priority Data

Jul. 31, 2013 (JP) ................................. 2013-158417

(51) Int. Cl.
*G11C 27/02* (2006.01)
*H03K 17/16* (2006.01)
*H01L 27/06* (2006.01)

(52) U.S. Cl.
CPC ........... *G11C 27/024* (2013.01); *H01L 27/0688* (2013.01)

(58) Field of Classification Search
CPC .............. G11C 27/024; H01L 29/2206; H01L 27/0688
USPC ...................................... 327/91, 94, 390, 589
See application file for complete search history.

(56) References Cited

U.S. PATENT DOCUMENTS

| 5,872,469 A * | 2/1999 | Nestler ................ G11C 27/026 327/390 |
| 6,127,702 A | 10/2000 | Yamazaki et al. |
| 7,176,742 B2 | 2/2007 | Aksin et al. |
| 2010/0148171 A1 | 6/2010 | Hayashi et al. |

(Continued)

FOREIGN PATENT DOCUMENTS

WO        2006/096748 A2        9/2006

OTHER PUBLICATIONS

Tomoyuki Ishii et al.; "A Poly-Silicon TFT With a Sub-5-nm Thick Channel for Low-Power Gain Cell Memory in Mobile Applications", IEEE Transactions on Electron Devices, vol. 51, No. 11; pp. 1805-1810; Nov. 1, 2004.
Wonchan Kim et al.; "An Experimental High-Density DRAM Cell with a Built-in Gain Stage"; IEEE Journal of Solid-State Circuits, vol. 29, No. 8; pp. 978-981; Aug. 1, 1994.
Shoji Shukuri et al.; "A Complementary Gain Cell Technology for Sub-1V Supply DRAMs"; IEDM 92: Technical Digest of International Electron Devices Meeting; pp. 1006-1008; Dec. 13, 1992.

*Primary Examiner* — Kenneth B Wells
(74) *Attorney, Agent, or Firm* — Fish & Richardson P.C.

(57) ABSTRACT

Electric charge is stored, in accordance with a bias voltage, in a gate of a transistor performing switching operation between an input terminal and an output terminal, and the gate is brought into an electrically floating state at the time of completing the storage of electric charge in the gate. One electrode of a capacitor is connected to the gate in an electrically floating state, and the potential of the other electrode of the capacitor is increased, so that the voltage of the gate is increased using capacitive coupling. The potential of the gate of the transistor is increased, and the bias voltage is sampled without being decreased. Each of the transistor performing switching operation and a transistor connected to the gate of the transistor is a transistor with an extremely low off-state current.

19 Claims, 12 Drawing Sheets

(56) References Cited

U.S. PATENT DOCUMENTS

2011/0089417 A1 4/2011 Yamazaki et al.
2013/0181854 A1 7/2013 Koyama et al.
2013/0271220 A1 10/2013 Takahashi et al.
2013/0272055 A1 10/2013 Yamamoto

OTHER PUBLICATIONS

Shoji Shukuri et al.; "A Semi-Static Complementary Gain Cell Technology for Sub-1 V Supply DRAM's"; IEEE Transactions on Electron Devices, vol. 41, No. 6; pp. 926-931; Jun. 1, 1994.

* cited by examiner

Pre-Sampe

Sample time

SEMICONDUCTOR DEVICE INCLUDING TRANSISTOR WHOSE GATE IS ELECTRICALLY CONNECTED TO CAPACITOR

BACKGROUND OF THE INVENTION

1. Field of the Invention

The present invention relates to an object, a method, or a manufacturing method. The present invention relates to a process, a machine, manufacture, or a composition of matter. One embodiment of the present invention relates to a semiconductor device, a display device, a light-emitting device, a power storage device, a driving method thereof, or a manufacturing method thereof. In particular, one embodiment of the present invention relates to a semiconductor device or a signal generation device including the semiconductor device.

2. Description of the Related Art

A bootstrap circuit that generates a voltage higher than or equal to a power supply voltage using capacitive coupling is known (see Patent Document 1).

REFERENCE

Patent Document

[Patent Document 1] PCT International Publication No. 2006/096748

SUMMARY OF THE INVENTION

It is necessary to consider the tolerance to an increased voltage in the case where a bootstrap circuit is used in another circuit, for example, in the case where the bootstrap circuit is used in a sample-and-hold circuit.

The sample-and-hold circuit is a circuit in which a voltage is applied to a gate of a transistor and a bias voltage is sampled. The voltage to be supplied to the gate is increased by the bootstrap circuit, whereby the bias voltage can be sampled without being decreased. However, there are problems as follows, for example. There is a necessity to consider a tolerance that an element has, and the number of elements is increased as in the structure described in Patent Document 1. Therefore, it is difficult to increase a voltage to be applied to a gate in the case where a bootstrap circuit which is not improved is used in a semiconductor device such as a sample-and-hold circuit. Thus, it is difficult for the semiconductor device like the sample-and-hold circuit to hold a bias voltage without decreasing the bias voltage. Furthermore, it is difficult to hold the bias voltage, which has been temporarily held, for a long period of time because of a leakage current via a transistor.

An object of one embodiment of the present invention is to provide a semiconductor device having a novel structure that can hold a bias voltage without decreasing the bias voltage, and a signal generation device including the semiconductor device. Another object of one embodiment of the present invention is to provide a semiconductor device having a novel structure that can extend a hold period of a bias voltage that has been temporarily held, and a signal generation device including the semiconductor device.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention provides a structure in which electric charge is stored, in accordance with a bias voltage, in a gate of a transistor performing switching operation between an input terminal and an output terminal, and the gate is brought into an electrically floating state at the time of completing the storage of electric charge in the gate. One electrode of a capacitor is connected to the gate in an electrically floating state, and the potential of the other electrode of the capacitor is increased, whereby capacitive coupling occurs; thus, the voltage of the gate is increased. The potential of the gate of the transistor is increased, and the bias voltage is sampled without being decreased.

In one embodiment of the present invention, each of the transistor performing switching operation and a transistor connected to the gate of the transistor is a transistor with an extremely low off-state current. A transistor in which a channel is formed in an oxide semiconductor film can be used as the transistor with an extremely low off-state current. The transistor including an oxide semiconductor is used as a switch, whereby the switch can have a high tolerance to an increased voltage, and the number of elements for increasing a tolerance to a voltage can be small. Furthermore, the amount of electric charge leaking through the switch in an off state is extremely small, achieving excellent bias voltage hold characteristics.

One embodiment of the present invention is a semiconductor device including a first transistor outputting a voltage applied to one of a source and a drain of the first transistor to the other of the source and the drain, and a capacitor including one electrode electrically connected to a gate of the first transistor. The gate of the first transistor is electrically connected to a power supply line via a second transistor and a third transistor and electrically connected to a ground line via a fourth transistor. A gate of the second transistor and a gate of the fourth transistor are supplied with a first control signal with which one of the second transistor and the fourth transistor is turned on and the other of the second transistor and the fourth transistor is turned off. A gate of the third transistor is supplied with the voltage. The gate of the first transistor is brought into an electrically floating state, and the other electrode of the capacitor is supplied with a second control signal with which a voltage of the gate of the first transistor is increased.

One embodiment of the present invention is a semiconductor device including a first transistor outputting a voltage applied to one of a source and a drain of the first transistor to the other of the source and the drain, and a capacitor including one electrode electrically connected to a gate of the first transistor. The gate of the first transistor is electrically connected to a power supply line via a second transistor and a third transistor and electrically connected to a ground line via a fourth transistor. A gate of the second transistor and a gate of the fourth transistor are supplied with a first control signal with which one of the second transistor and the fourth transistor is turned on and the other of the second transistor and the fourth transistor is turned off. A gate of the third transistor is supplied with the voltage. The gate of the first transistor is brought into an electrically floating state, and the other electrode of the capacitor is supplied with a second control signal with which a voltage of the gate of the first transistor is increased. The first transistor is a transistor including an oxide semiconductor layer as a semiconductor layer to be a channel formation region.

One embodiment of the present invention is a semiconductor device including a first transistor outputting a voltage applied to one of a source and a drain of the first transistor to the other of the source and the drain, and a capacitor including one electrode electrically connected to a gate of the first transistor. The gate of the first transistor is electrically connected to a power supply line via a second transistor and a third transistor and electrically connected to a ground line via a fourth transistor. A gate of the second transistor and a gate of the fourth transistor are supplied with a first control signal with which one of the second transistor and the fourth transistor is turned on and the other of the second transistor and the fourth transistor is turned off. A gate of the third transistor is supplied with the voltage. The gate of the first transistor is brought into an electrically floating state, and the other electrode of the capacitor is supplied with a second control signal with which a voltage of the gate of the first transistor is increased. The first transistor, the third transistor, and the fourth transistor are each a transistor including an oxide semiconductor layer as a semiconductor layer to be a channel formation region.

In the semiconductor device of one embodiment of the present invention, the second transistor is preferably a p-channel transistor including a silicon layer as a semiconductor layer to be a channel formation region.

In the semiconductor device of one embodiment of the present invention, the first transistor, the third transistor, and the fourth transistor are each a transistor provided in a layer over the second transistor.

One embodiment of the present invention is a signal generation device including the semiconductor device electrically connected to the gate of the transistor electrically connected to the power supply line.

In the signal generation device of one embodiment of the present invention, it is preferable that the gate of the transistor electrically connected to the ground line be electrically connected to the semiconductor device including the capacitor and the transistor having the oxide semiconductor layer as the semiconductor layer to be the channel formation region.

One embodiment of the present invention can provide a semiconductor device having a novel structure that can hold a bias voltage without decreasing the bias voltage, and a signal generation device including the semiconductor device. One embodiment of the present invention can provide a semiconductor device having a novel structure that can extend a period in which a generated voltage is sampled, and a signal generation device including the semiconductor device.

DETAILED DESCRIPTION OF THE INVENTION

Figure 1:
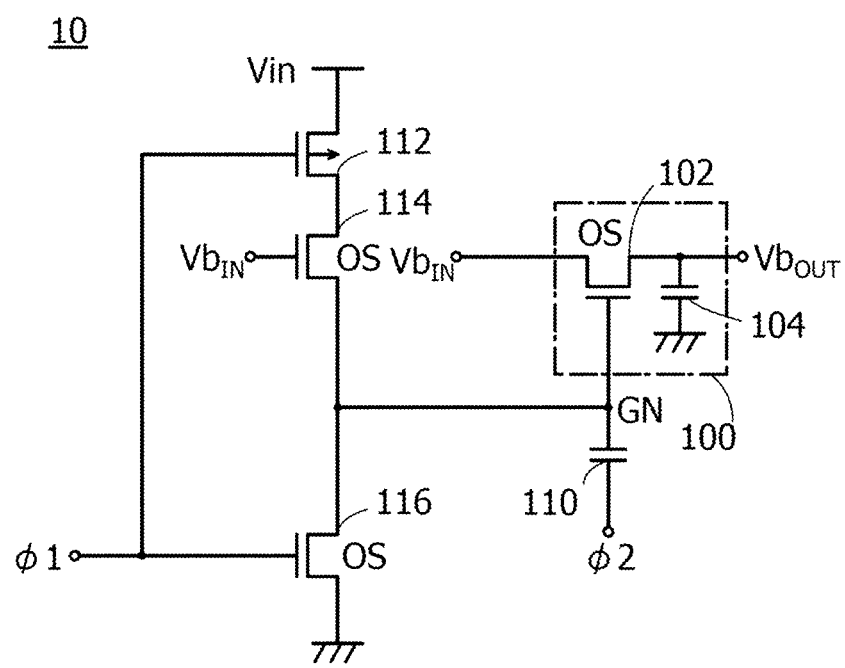
FIG. 1 is a circuit diagram according to one embodiment of the present invention.

Embodiments will be described below with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such a scale. Note that drawings are schematic views of ideal examples, and the embodiments of the present invention are not limited to the shape, the value, or the like illustrated in the drawings. For example, variation in signal, voltage, or current due to noise or a difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on a structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification and the like, ordinal numbers such as "first," "second," and "third" are used to avoid confusion among components, and thus do not limit the number of the components.

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

In this specification and the like, terms for describing arrangement, such as "over" and "under," are used for convenience for describing the positional relationship between components with reference to drawings. Further, the positional relation between components is changed as appropriate in accordance with a direction in which each component is described. Thus, there is no limitation on terms used in this specification, and description can be made appropriately depending on the situation.

In this specification and the like, the positional relationships of circuit blocks in diagrams are specified for description, and even in the case where different circuit blocks have different functions in the diagrams, the different circuit blocks might be provided in an actual circuit or region so that different functions are achieved in the same circuit or region.

Further, the function of each circuit block in a drawing is specified for description. Thus, even when one circuit block is illustrated, an actual circuit or region may be configured so that processing which is illustrated as being performed in the one circuit block is performed in a plurality of circuit blocks.

In this specification and the like, voltage refers to a difference between a given potential and a reference potential (e.g., a ground potential) in many cases. Accordingly, the voltage, the potential, and the potential difference can also be referred to as a potential, a voltage, and a voltage difference, respectively. Note that a voltage refers to a difference between potentials of two points, and a potential refers to electrostatic energy (electric potential energy) of a unit electric charge at a given point in an electrostatic field.

In this specification and the like, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the trigonal and rhombohedral crystal systems are included in the hexagonal crystal system.

Embodiment 1

In this embodiment, a circuit structure and operation of a semiconductor device are described.

Note that the semiconductor device is a circuit utilizing semiconductor characteristics. Here, a semiconductor device means a device including a semiconductor element. The term "semiconductor device" includes a driver circuit or the like for driving a circuit including a semiconductor element. In particular, in this specification, the semiconductor device is a circuit that serves as a sample-and-hold circuit.

FIG. 1 illustrates an example of a semiconductor device.

A semiconductor device 10 illustrated in FIG. 1 includes a transistor 102, a capacitor 104, a capacitor 110, a transistor 112, a transistor 114, and a transistor 116. Note that the transistor 102 and the capacitor 104 are also collectively referred to as a voltage hold portion 100.

The semiconductor device 10 is supplied with a power supply voltage, a bias voltage, a first control signal (abbreviated to ϕ1 in drawings), and a second control signal (abbreviated to ϕ2 in drawings).

Note that the power supply voltage is supplied through a power supply line and a ground line. The power supply line provides a high power supply potential VDD, and the ground line provides a ground potential GND. Note that the ground potential may be a low power supply potential VSS. Note that in general, a potential (a voltage) is relative and determined depending on the amount relative to a certain potential. Therefore, even when the expression "ground", "GND", or the like is used, the potential is not necessarily 0 V.

Note that the bias voltage is a voltage supplied to a terminal $Vb_{IN}$ and taken (sampled) into the voltage hold portion 100. The bias voltage is a voltage supplied to a terminal $Vb_{OUT}$ and held in the voltage hold portion 100. Note that in the description of this embodiment, the bias voltage is a voltage Vb in some cases.

Note that the first control signal and the second control signal are square wave signals. In this embodiment, the first control signal and the second control signal with the high power supply potential are referred to as H-level signals or H levels. The first control signal and the second control signal with a ground potential are referred to as L-level signals or L levels.

The semiconductor device 10 illustrated in FIG. 1 is a circuit that samples the voltage Vb of the terminal $Vb_{IN}$ at the time when the transistor 102 is turned on, and holds the voltage Vb of the terminal $Vb_{OUT}$ at the time when the transistor 102 is turned off. In this embodiment below, the structure of the semiconductor device 10 is employed, whereby the voltage of a gate of the transistor 102 can be increased without an increase in the number of elements, obtaining a semiconductor device in which the voltage Vb can be held without being decreased and a semiconductor device that can extend a period in which the voltage Vb is held.

Note that in this specification, "transistor is on" means that a source and a drain of the transistor are electrically conducted and also means that a current flows through the transistor because a voltage higher than the threshold voltage of the transistor is applied between a gate and the source of the transistor. In contrast, "transistor is off" means that a source and a drain of the transistor are not conducted electrically and also means that a current hardly flows through the transistor because a voltage lower than or equal to the threshold voltage of the transistor is applied between a gate and the source of the transistor.

The transistor 102 has a function as a switch and a function of taking the voltage Vb supplied to one of a source and a drain of the transistor 102 into the other of the source and the drain thereof in accordance with a potential supplied to its gate, and holding the voltage. Specifically, one of the source and the drain of the transistor 102 is connected to the terminal $Vb_{IN}$, the other of the source and the drain thereof is connected to the terminal $Vb_{OUT}$, and the gate thereof is connected to one electrode of the capacitor 110, the other of a source and a drain of the transistor 114, and one of a source and a drain of the transistor 116. The transistor 102 may also be referred to as first transistor.

The capacitor 104 has a function of holding the voltage Vb when the transistor 102 is off. Specifically, one electrode of the capacitor 104 is connected to the terminal $Vb_{OUT}$, and the other electrode thereof is connected to the ground line. Note that the terminal $Vb_{OUT}$ is preferably connected to an element with a low leakage current to hold the voltage Vb. For example, the terminal $Vb_{OUT}$ is preferably connected to a gate of another transistor.

Note that although FIG. 1 shows an example in which the other electrode of the capacitor 104 is connected to the wiring to which the ground potential is supplied, it is sufficient that the other electrode of the capacitor 104 is connected to a wiring with a constant potential. The capacitor 104 is not necessarily provided when a parasitic capacitance or a gate capacitance of another transistor is used.

Note that the voltage hold portion 100 including the transistor 102 and the capacitor 104 is a circuit which takes in the voltage Vb supplied to the terminal $Vb_{IN}$ and holds the voltage Vb in the terminal $Vb_{OUT}$. The voltage Vb taken in the voltage hold portion 100 is supplied to a circuit in the next stage of the semiconductor device 10. It is preferable that the value of the taken voltage Vb be not changed over time.

The transistor 102 in this embodiment is preferably a transistor with an extremely low off-state current, in which case the value of the voltage Vb taken in the terminal $Vb_{OUT}$ is prevented from being changed over time after the transistor 102 is turned off. A transistor in which a channel is formed in an oxide semiconductor film (hereinafter the transistor is referred to as OS transistor) can be used as the transistor with an extremely low off-state current.

Note that "low off-state current" means that a normalized off-state current per micrometer in channel width at room temperature is lower than or equal to 10 zA/μm. Since the off-state current is preferably as low as possible, the normalized off-state current is preferably lower than or equal to 1 zA/μm, more preferably lower than or equal to 10 yA/μm, still more preferably lower than or equal to 1 yA/μm. Note that a voltage between a source and a drain in that case is, for example, approximately 0.1 V, 5 V, or 10 V.

The transistor 102 is turned on or off in accordance with the potential of a node GN. The use of an OS transistor as the transistor 102 enables the amount of leakage of electric charge via the transistor 102 to be extremely small even in the case where the switch is turned off after the potential of the terminal $Vb_{OUT}$ is kept constant. Thus, in the structure of this embodiment, the amount of change in the voltage Vb of the terminal $Vb_{OUT}$ over time can be reduced, whereby a period in which the voltage Vb is held can be extended.

For that reason, the terminal $Vb_{OUT}$ can hold the voltage Vb by turning off the transistor 102. Accordingly, the voltage Vb does not need to be kept output from the terminal $Vb_{IN}$, and therefore, a circuit generating the voltage Vb (bias generation circuit) does not need to operate continuously. This makes it possible to stop the supply of power to a bias generation circuit in the previous stage of the semiconductor device 10 without stopping the operation of a circuit in the next stage of the semiconductor device 10. Thus, power consumption of the bias generation circuit can be reduced.

Note that in this specification, "OS" is added beside the OS transistor in drawings to indicate that the OS transistor includes an oxide semiconductor in a semiconductor layer to be a channel formation region.

The capacitor 110 is a circuit for increasing a voltage of the gate of the transistor 102 connected to one electrode of the capacitor 110 using capacitive coupling by making the gate of the transistor 102 into an electrically floating state and supplying the second control signal to the other electrode of the capacitor 110. Specifically, one electrode of the capacitor 110 is connected to the gate of the transistor 102, the other of the source and the drain of the transistor 114, and one of the source and the drain of the transistor 116, and the other electrode of the capacitor 110 is connected to a wiring to which the second control signal is supplied.

The second control signal is a signal for increasing the voltage of the gate of the transistor 102 using capacitive coupling when the gate is in an electrically floating state. Specifically, the second control signal is changed from L level to H level when the gate of the transistor 102 is in an electrically floating state. The second control signal is changed to L level in a period in which the voltage Vb is held after the voltage of the gate of the transistor 102 is increased and the sampling of the voltage Vb is completed.

The transistor 112 has a function as a switch with which the high power supply potential supplied to one of a source and a drain of the transistor 112 is supplied to the other of the source and the drain of the transistor 112 in accordance with the first control signal supplied to a gate of the transistor 112. Specifically, one of the source and the drain of the transistor 112 is connected to a power supply line Vin, the other of the source and the drain of the transistor 112 is connected to one of the source and the drain of the transistor 114, and the gate of the transistor 112 is connected to a wiring to which the first control signal is supplied. The transistor 112 may also be referred to as second transistor.

Note that the transistor 112 preferably has a polarity different from that of the transistor 116 whose gate is similarly supplied with the first control signal. In the structure of FIG. 1, the transistor 112 is a p-channel transistor because the transistor 116 is an n-channel transistor. It is sufficient that the transistor 112 and the transistor 116 are alternately turned on in accordance with the first control signal.

Note that the transistor 112 is preferably a transistor including silicon (Si) in a semiconductor layer to be a channel formation region (the transistor is hereinafter referred to as Si transistor). The Si transistor can easily be a p-channel transistor, and the Si transistor and the OS transistor can be stacked, achieving downsizing of the semiconductor device 10. Furthermore, the transistor 112 and the transistor 116 can be alternately turned on only with the first control signal.

The transistor 114 is a transistor in which a current flows between the source and the drain to store electric charge in the gate of the transistor 102 in accordance with the voltage Vb supplied to a gate thereof. Specifically, one of the source and the drain of the transistor 114 is connected to the other of the source and the drain of the transistor 112, the other of the source and the drain of the transistor 114 is connected to the gate of the transistor 102, one electrode of the capacitor, and one of the source and the drain of the transistor 116, and the gate of the transistor 114 is connected to the terminal $Vb_{IN}$. The transistor 114 may also be referred to as third transistor.

Note that the transistor 114 is preferably an OS transistor. The OS transistor has advantages such as an extremely low off-state current and a tolerance to a high voltage. The oxide semiconductor included in the OS transistor has a wider band gap than silicon included in the Si transistor by approximately 1 eV to 2 eV. Therefore, an avalanche breakdown hardly occurs and a tolerance to a high voltage is high. Thus, it is preferable to use the OS transistor as the transistor 114 that is supplied with a high voltage by increasing the voltage of the gate of the transistor 102.

The gate of the transistor 102 is connected to the power supply line Vin via the transistor 112 and the transistor 114. In a state where a current flows in the transistor 112 and the transistor 114, a current flows into the gate of the transistor 102 from the power supply line Vin, so that electric charge is stored.

The transistor 116 has a function as a switch with which the low power supply potential supplied to the other of the source and the drain of the transistor 116 is supplied to one of the source and the drain of the transistor 116 in accordance with the first control signal supplied to the gate of the transistor 116. Specifically, one of the source and the drain of the transistor 116 is connected to the gate of the transistor 102, one electrode of the capacitor, and the other of the source and the drain of the transistor 114, the other of the source and the drain of the transistor 116 is connected to the ground line, and the gate of the transistor 116 is connected to the wiring to which the first control signal is supplied. The transistor 116 may also be referred to as fourth transistor.

Note that the transistor 116 is preferably an OS transistor like the transistor 114. The transistor 116 is supplied with a high voltage like the transistor 114. Thus, it is preferable to use the OS transistor having the above-described characteristics as the transistor 116.

The gate of the transistor 102 is connected to the ground line via the transistor 116. In a state where a current flows in the transistor 116, a current flows into the ground line from the gate of the transistor 102, so that electric charge is released.

The first control signal is a signal for turning on one of the transistors 112 and 116 and turning off the other. Control is performed so that the voltage Vb is supplied to the gate of the transistor 114 and the terminal $Vb_{IN}$ in accordance with the first control signal, the first control signal is changed to L level before the period in which sampling is performed in the voltage hold portion 100 to turn on the transistor 112, and electric charge is stored in the gate of the transistor 102 in accordance with the first control signal. Furthermore, control is performed so that the voltage Vb is held in the terminal $Vb_{OUT}$ in accordance with the first control signal, the first control signal is changed to H level in a period in which holding is performed in the voltage hold portion 100 to turn on the transistor 116, and electric charge of the gate of the transistor 102 is released in accordance with the first control signal.

Note that in FIG. 1, the node GN refers to a node on a wiring connecting the gate of the transistor 102, one electrode of the capacitor, the other of the source and the drain of the transistor 114, and one of the source and the drain of the transistor 116.

The second control signal is a signal for increasing the potential of the node GN using capacitive coupling when the node GN is in an electrically floating state, i.e., when the storage and the release of electric charge in/from the node GN hardly occur in a state where a current flowing in the transistors 114 and 116 is extremely low and the transistors 114 and 116 are off. Specifically, the second control signal is changed from L level to H level when the node GN is in an electrically floating state. The second control signal is changed to L level in a period in which the voltage Vb is held after the potential of the node GN is increased and the sampling of the voltage Vb is completed.

After turning off the transistor 116 and turning on the transistor 112 by setting the first control signal to L level, the potential of the node GN is increased because of a current flowing in the transistor 114, and the voltage between the gate and the source of the transistor 114 is decreased to its threshold voltage or less, so that the transistor 114 is turned off. In this manner, the electrically floating state of the node GN is obtained.

In the structure of FIG. 1, the transistor 102 is preferably operated as a switch while the voltage Vb taken with the transistor 102 turned on is not changed owing to characteristics such as the threshold voltage of the transistor 102. To operate the transistor 102 as a switch, it is preferable to increase a voltage to be supplied to the gate, i.e., a voltage of the node GN so that the transistor 102 operates in a linear region.

In the structure of the semiconductor device 10 of this embodiment, the voltage of the node GN is increased so that the transistor 102 operates in a linear region. In order to increase the voltage of the node GN by the bootstrap operation, the node GN is brought into an electrically floating state, and the potential of the node GN is increased using capacitive coupling.

As described above, in the structure of this embodiment, the node GN is surrounded by the gate of the transistor 102, one electrode of the capacitor 110, the other of the source and the drain of the transistor 114, and one of the source and the drain of the transistor 116. The gate leakage current of the transistor 102, a current flowing in the capacitor 110, and the off-state current of the transistors 114 and 116 are extremely low, and the tolerance to a high voltage is higher than that of a semiconductor element including silicon or the like. Thus, the node GN can be in an electrically floating state and the voltage of the node GN can be increased using capacitive coupling without taking the tolerance to a high voltage into consideration.

It is possible to provide a semiconductor device having the above-described structure capable of outputting a bias voltage without decreasing the bias voltage and without increasing the number of elements. Furthermore, the semiconductor device can extend a period in which a voltage is held.

Figure 2:
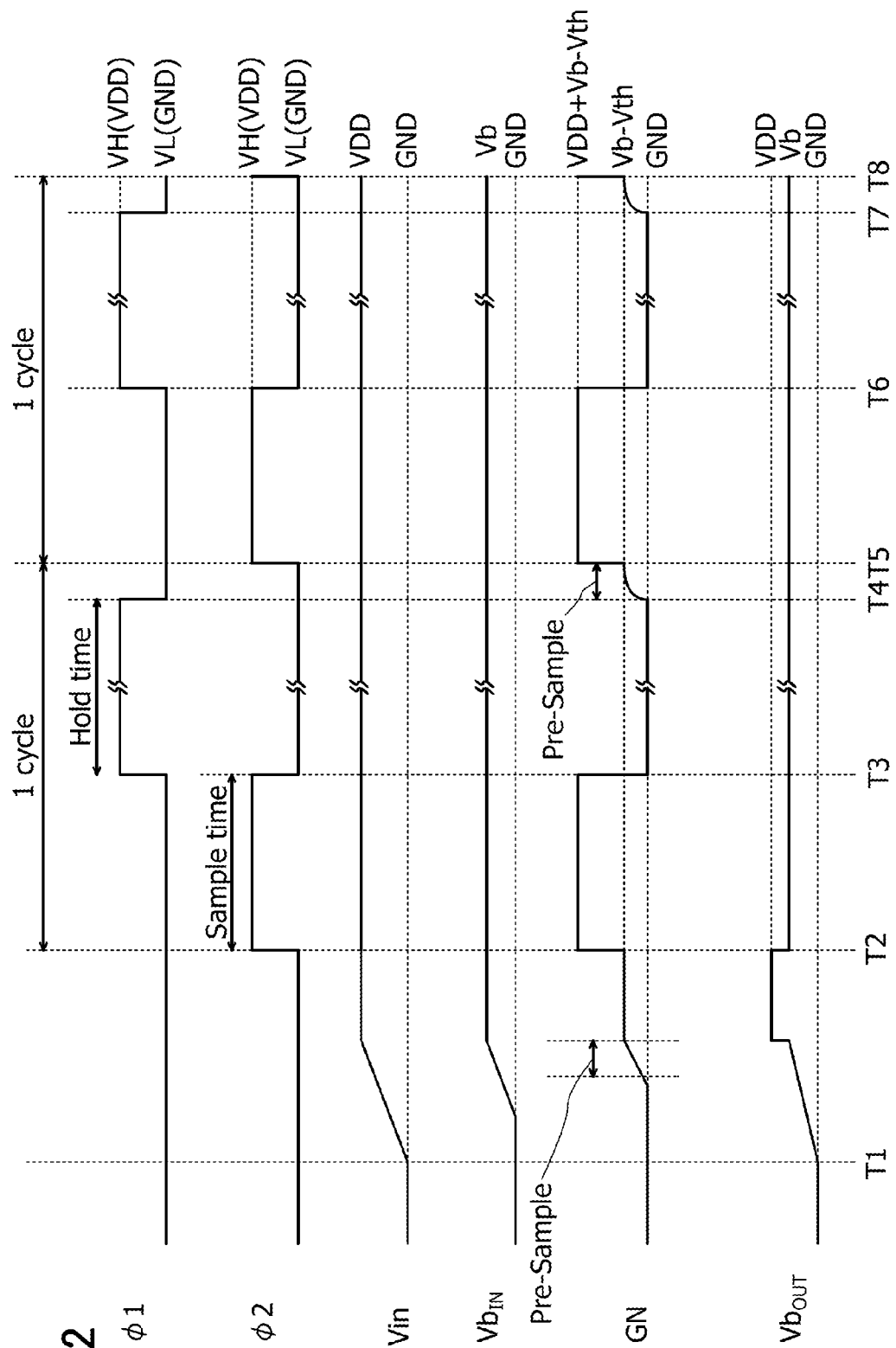
FIG. 2 is a timing chart according to one embodiment of the present invention.

FIG. 2 is a timing chart illustrating the operation of the semiconductor device 10.

The timing chart in FIG. 2 shows the changes in potentials of the first control signal, the second control signal, the power supply line Vin, the terminal $Vb_{IN}$, the node GN, and the terminal $Vb_{OUT}$ that are shown in FIG. 1.

Each of the first control signal and the second control signal is a signal represented by H level (abbreviated to "VH" in drawings) and L level (abbreviated to "VL" in drawings). Note that description will be made on the assumption that the H level of the first control signal and the second control signal is a high power supply potential VDD and the L level thereof is the same as the ground potential GND. In an initial state, the power supply line Vin is supplied with the ground potential GND. In the case of supplying the power supply voltage, the power supply line Vin is supplied with the high power supply potential VDD that is a constant potential. In an initial state, the terminal $Vb_{IN}$ is supplied with the ground potential GND. After the power supply voltage is supplied, the terminal $Vb_{IN}$ is supplied with the bias voltage Vb. In an initial state, the node GN is supplied with the ground potential GND. The potential of the node GN is changed by turning on or off the transistor included in the semiconductor device 10 and using capacitive coupling. In an initial state, the terminal $Vb_{OUT}$ is supplied with the ground potential GND. The potential of the terminal $Vb_{OUT}$ is changed by turning on or off the transistor included in the semiconductor device 10, so that the terminal $Vb_{OUT}$ is supplied with the bias voltage Vb.

Note that the timing chart in FIG. 2 illustrates the case where the other electrode of the capacitor (the capacitor 104 in FIG. 1) connected to the terminal $Vb_{OUT}$ is the power supply line Vin having a constant potential.

A period from a time T1 to a time T2 is a period for initialization operation. In the period from the time T1 to the time T2, the power supply voltage is supplied to a circuit including the semiconductor device 10. Specifically, the high power supply potential VDD is supplied to the power supply line Vin. The voltage Vb is supplied to the terminal $Vb_{IN}$. The L level is supplied as the first control signal and the second control signal. The transistor 112 is turned on, and the transistor 116 is turned off. With the increase in potential of the terminal $Vb_{IN}$, a current flows from the potential supply line Vin to the node GN via the transistor 114, and electric charge is stored. Thus, the potential of the node GN is increased until the transistor 114 is turned off, and the potential of the node GN becomes a potential (Vb−Vth) obtained by subtracting a threshold voltage Vth of the transistor 114 from the voltage Vb. The transistor 114 is turned off, whereby the node GN is brought into an electrically floating state.

Note that the terminal $Vb_{OUT}$ is in an electrically floating state. Therefore, the potential of the terminal $Vb_{OUT}$ is increased to the high power supply potential VDD because of the increase in potential of the power supply line Vin to the high power supply potential VDD.

Note that in the initialization operation in the period from the time T1 to the time T2, a period in which the potential of the node GN is increased to the potential (Vb−Vth) is hereinafter referred to as pre-sample period and abbreviated to "Pre-Sample" in drawings. In the pre-sample period, the potential of the node GN is increased to the potential (Vb−Vth) before sampling is performed in the voltage hold portion 100. The increase in the potential of the node GN in the pre-sample period allows the potential of the node GN to be higher than the high power supply potential VDD.

Figure 3A:
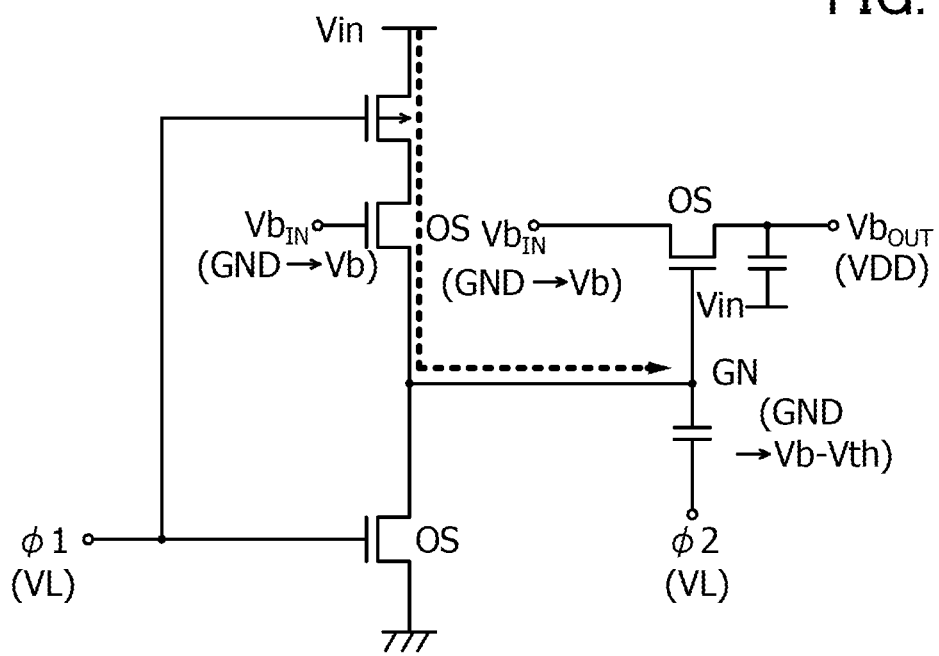
FIGS. 3A and 3B are circuit diagrams according to one embodiment of the present invention.

Note that in the pre-sample period, the transistor 112 is turned on and the transistor 116 is turned off. The potential of the node GN is increased because a current flows in the transistor 114 whose gate is supplied with the voltage Vb. With the increase in potential, the potential of the node GN is increased to the potential (Vb−Vth), and a voltage between the gate and the source of the transistor 114 is decreased to its threshold voltage or less; thus, the transistor 114 is turned off. Thus, in the pre-sample period, the node GN can be brought into the electrically floating state. The operation in the pre-sample period can be schematically shown using a dotted arrow in FIG. 3A. A current flows from the power supply line Vin to the node GN, whereby the potential of the node GN becomes the potential (Vb−Vth).

A period from the time T2 to a time T3 is a period in which the voltage Vb is sampled in the voltage hold portion 100. The period is hereinafter referred to as sample period and abbreviated to "Sample time" in drawings. In the period from the time T2 to the time T3, the first control signal is set to L level and the second control signal is set to H level. Because the potential of the other electrode of the capacitor 110 is increased, the potential of the node GN in the electrically floating state is increased by the amount of increase in the potential of the second control signal, using capacitive coupling. As a result of the increase using capacitive coupling, the potential of the node GN becomes a potential (VDD+Vb−Vth), whereby the transistor 102 whose gate is connected to the node GN can be operated in a linear region. Thus, the transistor 102 can be operated as a switch, and the potential of the terminal $Vb_{OUT}$ can be set to the voltage Vb that is the potential of the terminal $Vb_{IN}$.

Figure 3B:
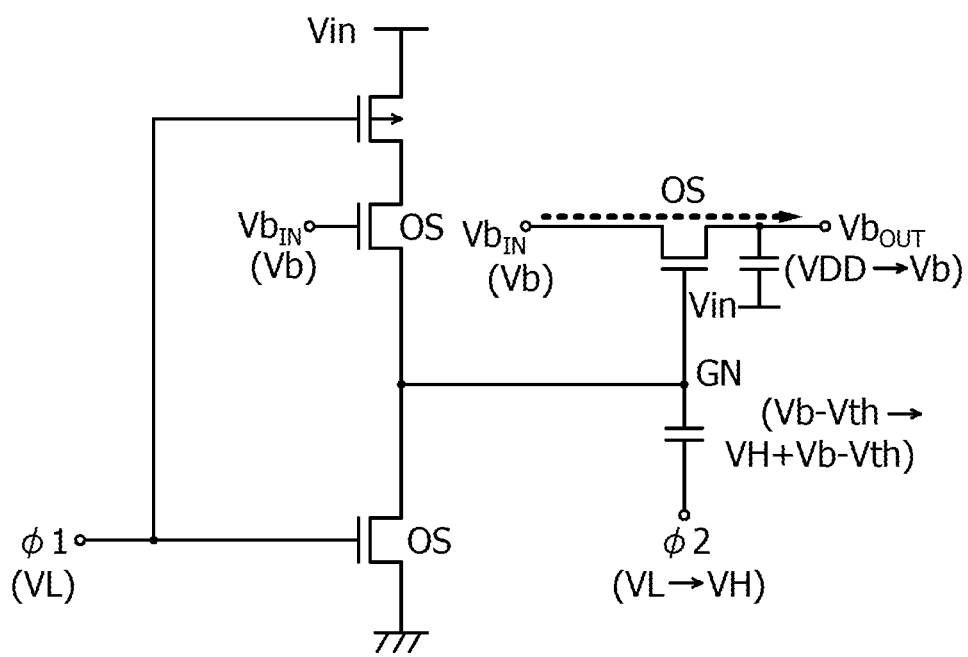

Note that in the above-described sample period, both of the transistors 114 and 116 are turned off, and the potential of the node GN in the electrically floating state is increased by the amount of increase in the potential of the second control signal because of capacitive coupling via the capacitor 110; thus, the potential of the node GN becomes the potential (VDD+Vb−Vth). As a result, the transistor 102 is turned on, and the potential of the terminal $Vb_{OUT}$ is increased. The operation in the sample period can be schematically shown using a dotted arrow in FIG. 3B. A current flows from the terminal $Vb_{IN}$ to the terminal $Vb_{OUT}$, whereby the potential of the terminal $Vb_{OUT}$ becomes the voltage Vb.

A period from the time T3 to a time T4 is a period in which the voltage Vb is held in the voltage hold portion 100. The period is hereinafter referred to as hold period and abbreviated to "Hold time" in the drawing. In the period from the time T3 to the time T4, the first control signal is set to H level and the second control signal is set to L level, whereby the transistor 112 is turned off and the transistor 116 is turned on. Thus, the node GN is electrically connected to the ground line, and electric charge of the node GN is released. With the release of electric charge, the potential of the node GN becomes the ground potential. The transistor 102 whose gate is connected to the node GN is turned off. Thus, the potential of the terminal $Vb_{OUT}$ can be kept in the state of the previous period, namely, the voltage Vb.

Figure 4:
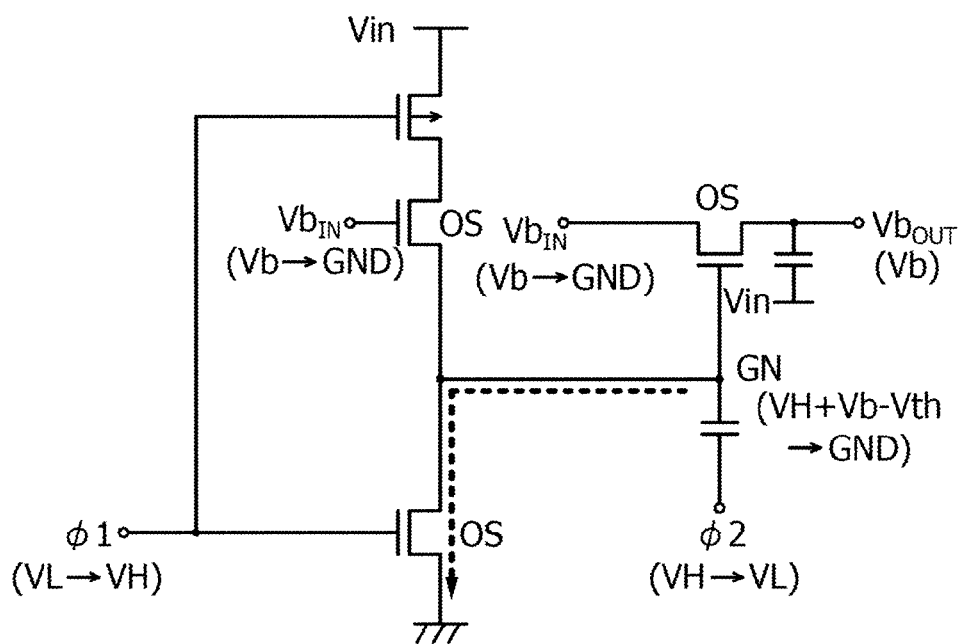
FIG. 4 is a circuit diagram according to one embodiment of the present invention.

Note that in the hold period, the transistor 112 is turned off and the transistor 116 is turned on. Thus, electric charge of the node GN whose potential is increased in the sample period is released via the transistor 116, so that the potential of the node GN becomes the ground potential. As a result, the transistor 102 is turned off, and the potential of the terminal $Vb_{OUT}$ is held. The operation in the hold period can be schematically shown using a dotted arrow in FIG. 4. A current flows from the node GN to the ground line, whereby the potential of the node GN becomes the ground potential.

A period from the time T4 to a time T5 is a pre-sample period in which the potential of the node GN is increased for use in the next period because the potential of the node GN is decreased to the ground potential in the hold period. That is, the transistor 112 is turned on and the transistor 116 is turned off, a current flows in the transistor 114 in accordance with the voltage Vb, and the potential of the node GN is increased. Specifically, the potential of the node GN is increased to the potential (Vb−Vth).

Here, a period from the time T2 to the time T5 described above is regarded as one cycle (abbreviated to "1 cycle" in the drawing). After the time T5, the operation in one cycle is repeated, so that sampling and holding of the voltage Vb can be performed. Note that the operation in the period from the time T5 to the time T8 that is shown in FIG. 2 is similar to the operation in the period from the time T2 to the time T5.

As described above, the semiconductor device 10 can be operated in a manner illustrated in the timing chart of FIG. 2.

Figure 5A:
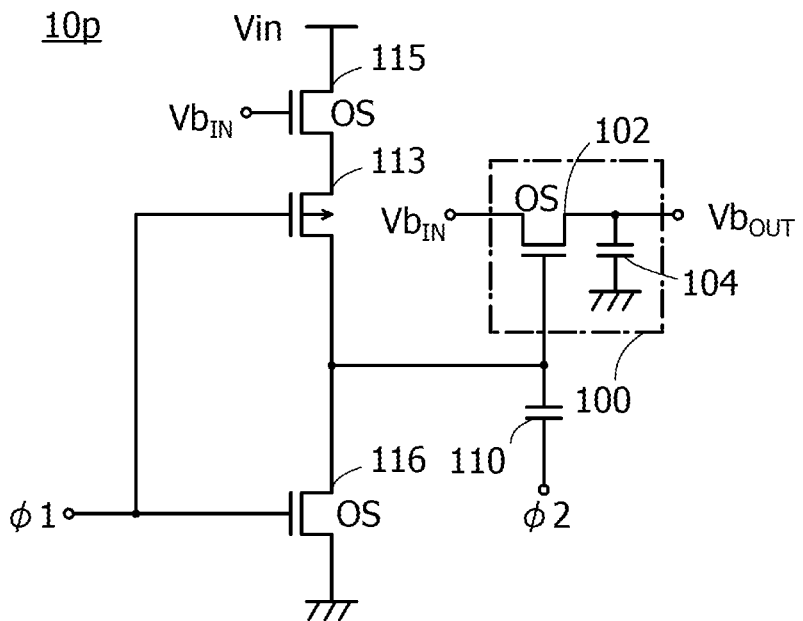
FIGS. 5A and 5B are circuit diagrams according to one embodiment of the present invention.

In FIG. 1, the transistor 112 which is a p-channel transistor and the transistor 114 which is an OS transistor are provided in this order from the power supply line Vin side, but the connection relation of the p-channel transistor and the OS transistor may be reversed. That is, as in a semiconductor device 10p of FIG. 5A, a transistor 115 which is an OS transistor and a transistor 113 which is a p-channel transistor may be provided in this order from the power supply line Vin side.

Figure 5B:
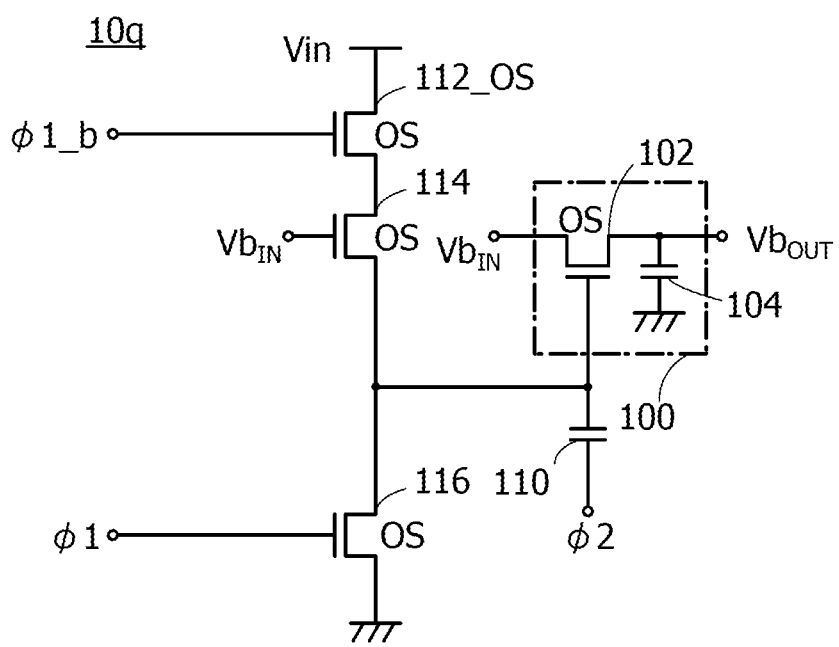

In FIG. 1, the transistor 112 and the transistor 116 have different polarities so that the transistor 112 and the transistor 116 are not turned on or off concurrently. However, the transistors may have the same polarity and/or include semiconductor layers having the same semiconductor material. For example, like a semiconductor device 10q illustrated in FIG. 5B, a transistor 112_OS which is an OS transistor may be provided instead of a p-channel transistor, and a first inversion control signal (abbreviated to φ1_b in the drawing) obtained by inverting the first control signal may be applied to a gate of the transistor 112_OS.

One embodiment of the present invention which is described above can provide a semiconductor device having the above-described structure capable of outputting a bias voltage without decreasing the bias voltage and without increasing the number of elements. Furthermore, one embodiment of the present invention can provide a semiconductor device that can extend a period in which a voltage is held.

This embodiment can be implemented in appropriate combination with any of the other embodiments.

Embodiment 2

In this embodiment, a specific example of a structure of a signal generation device including the semiconductor device 10 described in Embodiment 1 is described. Description below is made with reference to FIG. 6, FIG. 7, FIG. 8, FIGS. 9A and 9B, and FIGS. 10A and 10B.

Figure 6:
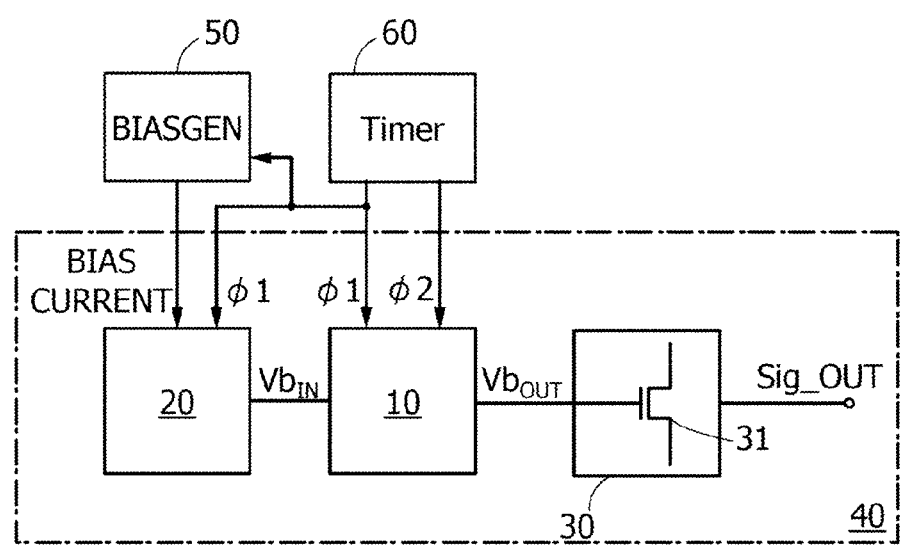
FIG. 6 is a block diagram according to one embodiment of the present invention.

FIG. 6 illustrates an example of a block diagram of a signal generation device 40 including the semiconductor device 10 illustrated in FIG. 1.

Note that the signal generation device is a device which generates and outputs a signal in accordance with a signal, a current, or a voltage that are input thereto. Specific examples of the signal generation device include a triangle wave generation circuit and an operational amplifier.

The signal generation device 40 illustrated in FIG. 6 includes the semiconductor device 10, a bias voltage generation portion 20, and a signal output portion 30. Furthermore, in FIG. 6, a reference bias generation circuit (abbreviated to "BIASGEN" in the drawing) 50 that supplies a bias current (abbreviated to "BIAS CURRENT" in drawings) to the bias voltage generation portion 20 and a timer 60 that supplies a first control signal (abbreviated to "φ1" in drawings) and a second control signal (abbreviated to "φ2" in drawings) to the semiconductor device 10 and the bias voltage generation portion 20 are included in addition to the signal generation device 40. The signal output portion 30 includes a transistor 31 for outputting an output signal Sig_OUT.

The bias voltage generation portion 20 is a circuit having a function of generating the voltage Vb to be a bias voltage used in the signal output portion 30, in accordance with the bias current supplied from the reference bias generation circuit 50. After being temporarily held in the semiconductor device 10, the voltage Vb is supplied to a gate of the transistor 31 included in the signal output portion 30. Note that the bias voltage generation portion 20 may be formed using a current-mirror circuit.

Note that although the power supply voltage is supplied to the bias voltage generation portion 20, the supply of the power supply voltage can be stopped in accordance with the first control signal output from the timer 60, so that the generation of the voltage Vb can be stopped. Note that in order to stop the supply of the power supply voltage, a switch for power gating may be provided between the power supply line Vin and the bias voltage generation portion 20 to turn the switch on or off.

The signal output portion 30 is a circuit having a function of outputting the signal Sig_OUT while the voltage Vb is supplied from the semiconductor device 10. Note that the signal output portion 30 may be formed using a differential amplifier circuit and a current-mirror circuit.

The semiconductor device 10 is a circuit to which the voltage Vb is input and from which the voltage Vb is output in accordance with the first control signal and the second control signal, as described in Embodiment 1. As another example of the structure described in Embodiment 1, a part of the semiconductor device 10 may include a transistor serving as a switch and a capacitor.

The reference bias generation circuit 50 is a circuit having a function of generating the bias current used in the signal generation device 40. Note that the reference bias generation circuit 50 is supplied with the power supply voltage, and can stop generating the bias current in accordance with the first control signal output from the timer 60. Note that in order to stop the generation of the bias current, a potential may be applied to a gate of a transistor in the reference bias generation circuit 50 so that the transistor is not operated.

The timer 60 is a circuit having a function of outputting the first control signal and the second control signal for switching a state every specified period of time to a circuit included in the signal generation device 40. The first control signal and the second control signal are signals for switching a state every specified period of time, as described in Embodiment 1. The signal may be a signal that can be switched every specified period of time by counting the wave number of a clock signal using a counter or the like, or a signal obtained by delaying the signal.

In the signal generation device 40 having the above-described structure, sampling or holding of the voltage Vb can be intermittently selected by the first control signal and the second control signal from the timer 60. The switching can be conducted along with shutting off the supply of the power supply voltage to the circuit included in the signal generation device 40 using power gating. Note that the signal output portion 30 holds the voltage Vb generated in the bias voltage generation portion 20; even in a period where the supply of voltage to the bias voltage generation portion 20 is stopped, the output signal Sig_OUT can be continuously output to a circuit in the next stage. Thus, the signal generation device 40 having the structure of this embodiment is excellent in reducing power consumption. Furthermore, the signal generation device 40 having the structure of this embodiment can be operated without a reduction in performance even when the supply of power to the bias voltage generation portion 20 is stopped.

Figure 7:
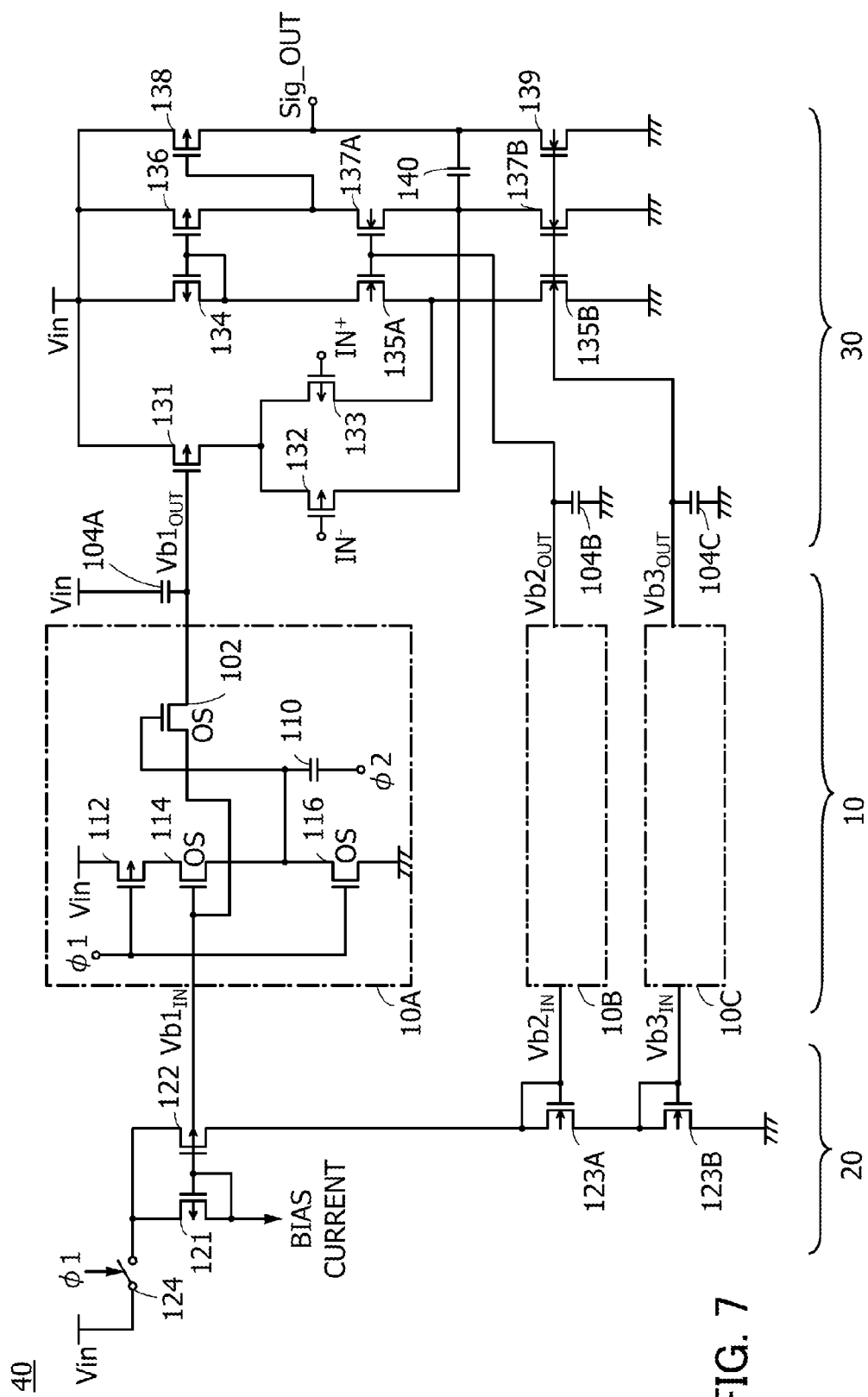
FIG. 7 is a circuit diagram according to one embodiment of the present invention.

FIG. 7 illustrates a specific example of a circuit configuration of the signal generation device 40. The signal generation device 40 illustrated in FIG. 7 is a circuit having a function of an operational amplifier.

The bias voltage generation portion 20 illustrated in FIG. 7 includes a transistor 121, a transistor 122, a transistor 123A, a transistor 123B, and a switch 124. The transistor 121 and the transistor 122 form a current-mirror circuit. In the bias voltage generation portion 20 illustrated in FIG. 7, a voltage Vb1 to be supplied to a terminal $Vb1_{IN}$, a voltage Vb2 to be supplied to a terminal $Vb2_{IN}$, and a voltage Vb3 to be supplied to a terminal $Vb3_{IN}$ are generated in accordance with the bias current supplied to a current controlled power source. Note that the switch 124 is a switch for power gating that is provided to stop the supply of a power supply voltage.

The semiconductor device 10 illustrated in FIG. 7 includes a semiconductor device 10A that is provided between the terminal $Vb1_{IN}$ and a terminal $Vb1_{OUT}$ and outputs the voltage Vb1, a semiconductor device 10B that is provided between the terminal $Vb2_{IN}$ and a terminal $Vb2_{OUT}$ and outputs the voltage Vb2, and a semiconductor device 10C that is provided between the terminal $Vb3_{IN}$ and a terminal $Vb3_{OUT}$ and outputs the voltage Vb3. The semiconductor device 10A (or the semiconductor device 10B or 10C) is supplied with the power supply voltage, and the operation thereof is controlled in accordance with the voltage Vb1 (or the voltage Vb2 or Vb3), the first control signal, and the second control signal.

Description of the transistor 102, the capacitor 110, the transistor 112, the transistor 114, and the transistor 116 included in the semiconductor device 10 of Embodiment 1 can be referred to for components included in the semiconductor devices 10A to 10C.

Note that a constant potential supplied to a capacitor 104A is preferably the high power supply potential VDD supplied to the power supply line Vin. Furthermore, a constant potential supplied to a capacitor 104B and a capacitor 104C is preferably the ground potential supplied to the ground line, as in the capacitor 104 included in the semiconductor device 10 described in Embodiment 1.

The signal output portion 30 illustrated in FIG. 7 is a circuit functioning as a differential amplifier circuit that amplifies and outputs the difference between potentials supplied to an input terminal $In^+$ and an input terminal $In^-$, for example. The signal output portion 30 illustrated in FIG. 7 includes a transistor 131, a transistor 132, a transistor 133, a transistor 134, a transistor 135A, a transistor 135B, a transistor 136, a transistor 137A, a transistor 137B, a transistor 138, a transistor 139, and a capacitor 140. With the transistor 131, the transistor 132, the transistor 133, the transistor 134, the transistor 135A, the transistor 135B, the transistor 136, the transistor 137A, the transistor 137B, the transistor 138, the transistor 139, and the capacitor 140, the difference between the potentials supplied to the input terminal $In^+$ and the input terminal $In^-$ can be amplified using the voltage Vb1 supplied to a gate of the transistor 131, the voltage Vb2 supplied to gates of the transistor 135A and the transistor 137A, and the voltage Vb3 supplied to gates of the transistor 135B, the transistor 137B, and the transistor 139; thus, the output signal Sig_OUT can be obtained.

In each of the semiconductor device 10A, the semiconductor device 10B, and the semiconductor device 10C, by turning off the transistor 102 serving as a switch, the voltages Vb1, Vb2, and Vb3 generated in the bias voltage generation portion 20 can be held in a node to which the capacitor 104A is connected, a node to which the capacitor 104B is connected, and a node to which the capacitor 104C is connected. Accordingly, the voltages Vb1, Vb2, and Vb3 generated in the bias voltage generation portion 20 do not need to be kept output, and therefore, the bias voltage generation portion 20 does not need to operate continuously. Consequently, the supply of voltage to the bias voltage generation portion 20 can be stopped by turning off the switch 124 without stopping the operation of the signal output portion 30. Thus, in the signal generation device 40, power consumption of the bias voltage generation portion 20 can be reduced.

The transistors included in the bias voltage generation portion 20 and the signal output portion 30 are preferably transistors in each of which silicon (Si) is used for a semiconductor layer to be a channel formation region. Such a structure can increase the amount of current flowing in the transistors, achieving high-speed circuit operation.

In the structure of the signal generation device 40 illustrated in FIG. 7, the semiconductor device 10 described in Embodiment 1 is used for the side where a high-side transistor is provided and the side where a low-side transistor is provided; however, the structure of the signal generation device 40 is not limited thereto.

Figure 8:
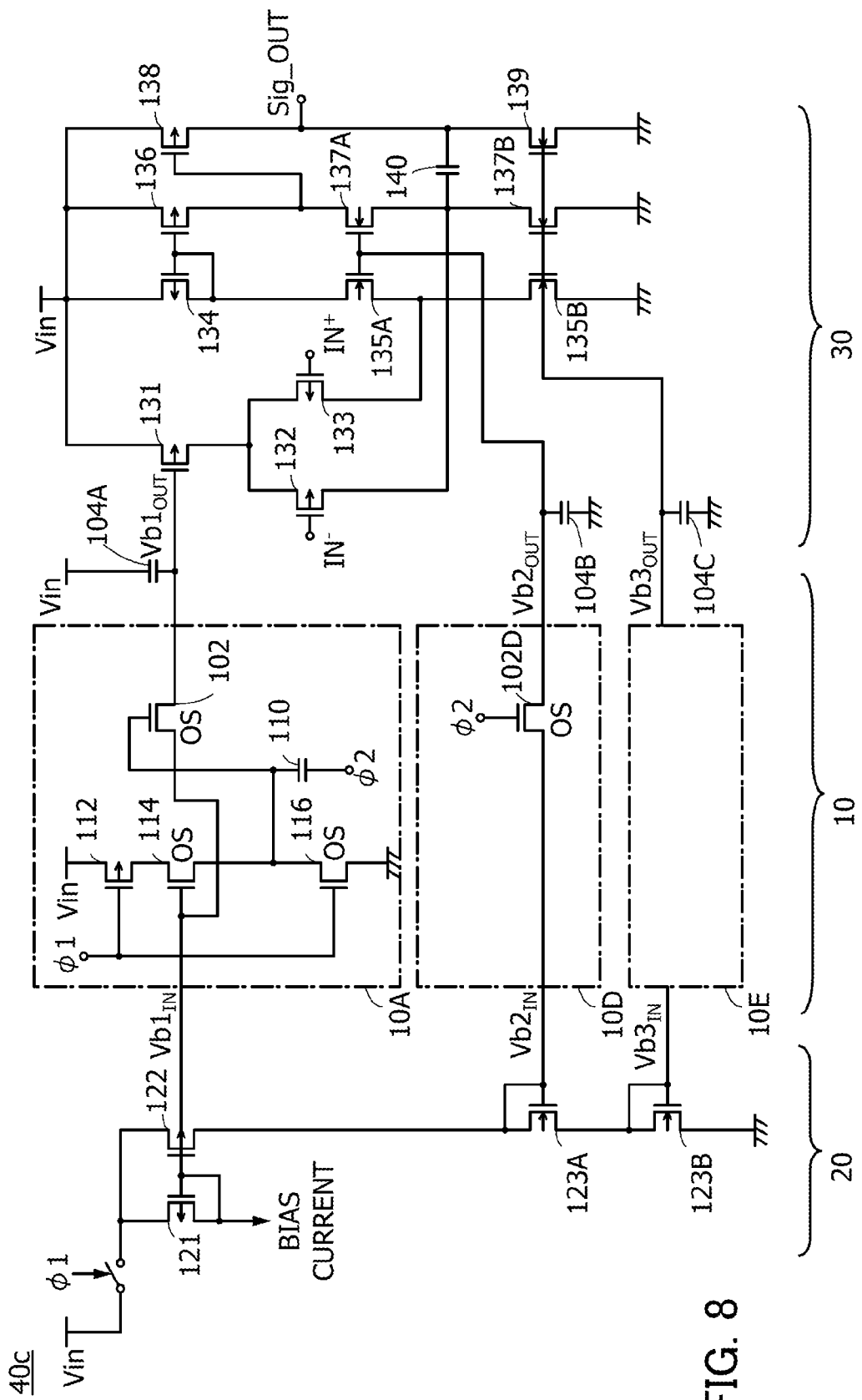
FIG. 8 is a circuit diagram according to one embodiment of the present invention.

As another example, as shown in FIG. 8, the semiconductor device 10 described in Embodiment 1 may be used for only the semiconductor device 10A on the side where the high-side transistor is provided, and a sample-and-hold circuit including a transistor serving as a switch and a capacitor may be used for semiconductor devices 10D and 10E on the side where the low-side transistor is provided.

In a signal generation device 40c of FIG. 8, the semiconductor devices 10D and 10E each including a transistor serving as a switch and a capacitor are used instead of the semiconductor devices 10B and 10C illustrated in FIG. 7. In FIG. 8, the voltages Vb2 and Vb3 held in the semiconductor devices 10D and 10E on the side where the low-side transistor is provided may be somewhat varied because the variation does not hinder the operation of the circuit in the next stage.

The structure illustrated in FIG. 8 allows reduction in the number of elements included in the semiconductor devices 10D and 10E, achieving reduction in size of the signal generation device.

Figure 9A:
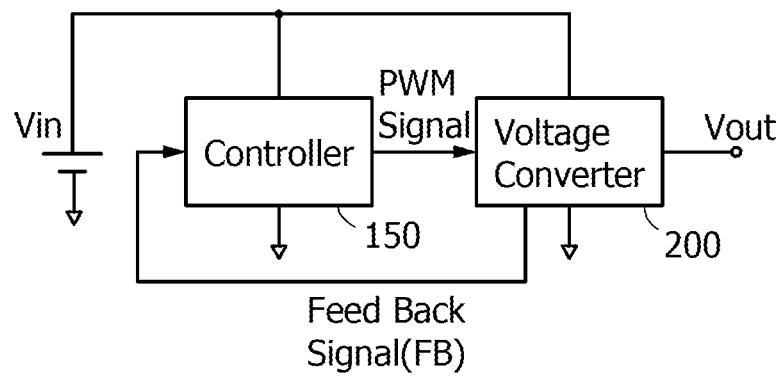
FIGS. 9A and 9B are block diagrams according to one embodiment of the present invention.

FIG. 9A is a block diagram of a DC-DC converter as an example of a circuit which can include the signal generation device illustrated in FIG. 7.

A DC-DC converter 90 illustrated in FIG. 9A includes a control circuit 150 (abbreviated to "Controller" in drawings) and a voltage converter circuit 200 (abbreviated to "Voltage Converter" in drawings).

The DC-DC converter 90 is a circuit for converting an voltage V1 to a voltage V2. The voltage V1 is preferably a direct-current voltage. In the case where the voltage V1 is an alternating voltage, it is preferable that the alternating voltage be converted to a direct-current voltage and the direct-current voltage be supplied to the DC-DC converter 90.

The control circuit 150 outputs a pulse width control signal (abbreviated to "PWM Signal" in drawings) for controlling on or off of a transistor serving as a switch included in the voltage converter circuit 200. The control circuit 150 is supplied with the voltage V1 and a feedback signal (abbreviated to "Feed Back Signal (FB)" in drawings) from the voltage converter circuit 200 and outputs the pulse width control signal.

The voltage converter circuit 200 includes the transistor serving as a switch and converts the voltage V1 to the voltage V2 by switching on or off of the transistor. The voltage V2 is obtained by stepping up or stepping down the voltage V1. The voltage converter circuit 200 in this embodiment may have a circuit configuration which steps up the voltage V1 or steps down the voltage V1. Note that the transistor serving as a switch is preferably a transistor including single crystal silicon or SiC to enable high-speed switching operation; alternatively, a transistor including another semiconductor material may be used.

Figure 9B:
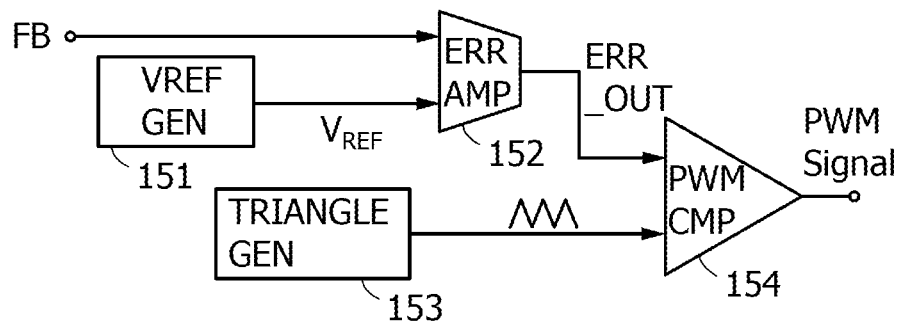

FIG. 9B is a block diagram illustrating a structural example of the control circuit 150 in the structure of the DC-DC converter 90 illustrated in FIG. 9A.

The control circuit 150 illustrated in FIG. 9B includes a reference voltage generation circuit 151 (abbreviated to "VREFGEN" in the drawing), an error amplifier 152 (abbreviated to "ERRAMP" in the drawing), a triangle wave generation circuit 153 (abbreviated to "TRIANGLE GEN" in the drawing), and a comparator 154 (abbreviated to "PWNCMP" in the drawing), for example.

The reference voltage generation circuit 151 has a function of generating a reference voltage $V_{REF}$. The reference voltage $V_{REF}$ is supplied to the error amplifier 152, for example.

The error amplifier 152 is a circuit having a function of generating an error signal (abbreviated to ERR_OUT in the drawing) obtained by amplifying a difference between the potential of the feedback signal and the reference voltage $V_{REF}$. The error amplifier 152 includes an operational amplifier (op-amp) and an operational trans-conductance amplifier (OTA), for example.

Note that each of the operational amplifier and the operational trans-conductance amplifier of the error amplifier 152 includes the semiconductor device 10 described in Embodiment 1, the bias voltage generation portion 20, and the signal output portion 30 that are described with reference to FIG. 7. Thus, the number of elements of a circuit included in the semiconductor device can be reduced, and the error amplifier is excellent in sampling and holding the bias voltage. Furthermore, the error amplifier can output an error signal from the signal output portion without a reduction in performance even when the supply of power to the bias voltage generation portion is stopped.

The triangle wave generation circuit 153 is a circuit having a function of generating a triangle wave to be used in the control circuit 150. The triangle wave generation circuit 153 includes the semiconductor device 10 described in Embodiment 1, the bias voltage generation portion 20, and the signal output portion 30 that are described with reference to FIG. 7. Thus, the number of elements of a circuit included in the semiconductor device can be reduced, and the triangle wave generation circuit is excellent in sampling and holding the bias voltage. Furthermore, the triangle wave generation circuit can output a triangle wave from the signal output portion without a reduction in performance even when the supply of power to the bias voltage generation portion is stopped.

The comparator 154 is a circuit to which the error signal and the triangle wave are supplied. The comparator 154 has a function of generating a pulse width control signal for controlling on or off of the transistor serving as a switch in the voltage converter circuit 200. Note that the comparator 154 includes the semiconductor device 10 described in Embodiment 1, the bias voltage generation portion 20, and the signal output portion 30 that are described with reference to FIG. 7. Thus, the number of elements of a circuit included in the semiconductor device can be reduced, and the comparator is excellent in sampling and holding the bias voltage. Furthermore, the comparator can output a pulse width control signal from the signal output portion without a reduction in performance even when the supply of power to the bias voltage generation portion is stopped.

Figure 10A:
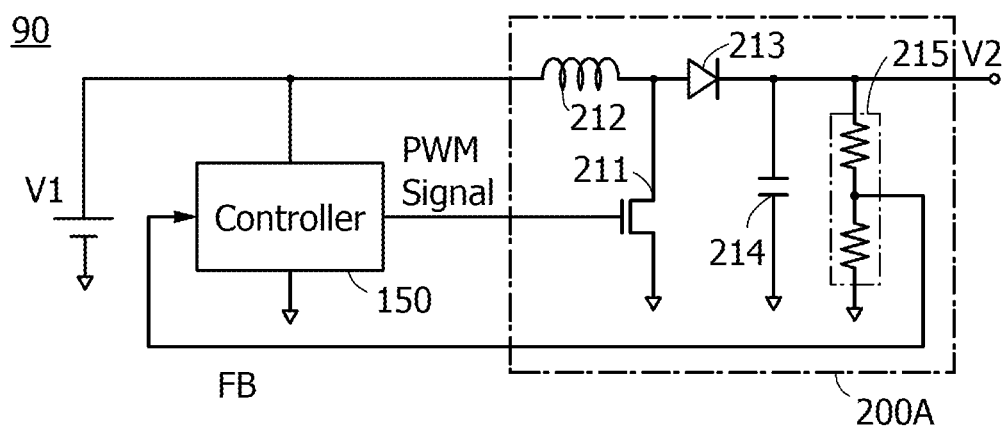
FIGS. 10A and 10B are circuit diagrams according to one embodiment of the present invention.

FIG. 10A is a block diagram illustrating an example of a structure in which a non-isolated step-up choke type voltage converter circuit 200A is used in the structure of the DC-DC converter 90 illustrated in FIG. 9A.

The voltage converter circuit 200A illustrated in FIG. 10A includes a transistor 211 serving as a switch, a coil 212, a diode 213, a capacitor 214, and resistors 215 connected in series.

The transistor 211 controls electrical connection between a node located between the coil 212 and the diode 213 and a constant potential (e.g., ground potential). Specifically, one of a source and a drain of the transistor 211 is connected to the node between the coil 212 and the diode 213, and the other of the source and the drain thereof is connected to the constant potential.

One terminal of the coil 212 is supplied with the voltage V1, and the other terminal thereof is connected to one electrode of the diode 213.

The other electrode of the diode 213 is connected to a terminal to which the voltage V2 is applied.

One electrode of the capacitor 214 is connected to the terminal to which the voltage V2 is applied, and the other electrode thereof is connected to the constant potential.

The resistors 215 are provided so that resistor division occurs between the terminal to which the voltage V2 is applied and the terminal to which the constant potential is applied. A voltage obtained by the resistor division is applied to the control circuit 150 as a feedback signal.

In the voltage converter circuit 200A illustrated in FIG. 10A, as the rate of a period in which the transistor 211 is on increases, the amount of current flowing in the coil 212 increases, and a voltage can be stepped up so that the difference between the voltage V2 and the voltage V1 is increased. Alternatively, as the rate of a period in which the transistor 211 is off increases, the amount of current flowing in the coil 212 decreases, and a voltage can be stepped up so that the difference between the voltage V2 and the voltage V1 is decreased.

Figure 10B:
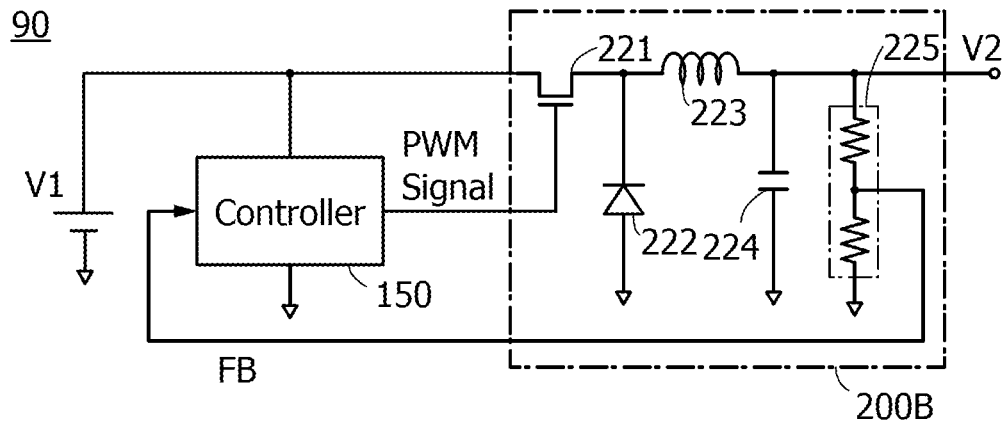

FIG. 10B is a block diagram illustrating an example of a structure using a non-isolated step-down choke type voltage converter circuit 200B in the structure of the DC-DC converter 90 illustrated in FIG. 9A.

The voltage converter circuit 200B illustrated in FIG. 10B includes a transistor 221 serving as a switch, a diode 222, a coil 223, a capacitor 224, and resistors 225 connected in series.

The transistor 221 controls electrical connection between a node to which the voltage V1 is applied and a node between the diode 222 and the coil 223. Specifically, one of a source and a drain of the transistor 221 is connected to a terminal to which the voltage V1 is applied, and the other of the source and the drain thereof is connected to the node between the diode 222 and the coil 223.

One electrode of the diode 222 is connected to the node between the diode 222 and the coil 223, and the other electrode thereof is connected to a constant potential.

One terminal of the coil 223 is connected to the node between the diode 222 and the coil 223, and the other terminal thereof is connected to the terminal to which the voltage V2 is applied.

One electrode of the capacitor 224 is connected to the terminal to which the voltage V2 is applied, and the other electrode thereof is connected to the constant potential.

The resistors 225 are provided so that resistor division occurs between the terminal to which the voltage V2 is applied and the terminal to which the constant potential is applied. A voltage obtained by the resistor division is applied to the control circuit 150 as a feedback signal.

In the voltage converter circuit 200B illustrated in FIG. 10B, as the rate of a period in which the transistor 221 is on increases, a voltage held in the capacitor 224 can be stepped down so as to approach the voltage V1. Alternatively, as the rate of a period in which the transistor 221 is off increases, a voltage held in the capacitor 224 can be decreased and stepped down.

The voltage converter circuits 200A and 200B illustrated in FIGS. 10A and 10B are the non-isolated step-up choke type voltage converter circuit and the non-isolated step-down choke type voltage converter circuit. However, an isolated forward voltage converter circuit, an isolated flyback voltage converter circuit, a half-bridge voltage converter circuit, or a full-bridge voltage converter circuit can be used.

The signal generation device described in this embodiment has the structure of the semiconductor device described in Embodiment 1. Thus, the number of elements included in a circuit can be reduced. Furthermore, the signal generation device described in this embodiment is excellent in sampling and holding the bias voltage and can operate without a reduction in performance even when the supply of power to part of a circuit is stopped.

The structure described above in this embodiment can be combined as appropriate with any of the structures described in the other embodiments.

Embodiment 3

In this embodiment, an oxide semiconductor layer that can be used for the semiconductor layer to be a channel formation region of the transistor with low off-state current described in the above embodiment is described.

An oxide semiconductor used for the semiconductor layer to be a channel formation region of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer to be a channel formation region of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

When the oxide semiconductor film forming the semiconductor layer to be a channel formation region contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type (intrinsic) or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1\times10^{-18}$ A, preferably less than or equal to $1\times10^{-21}$ A, and more preferably $1\times10^{-24}$ A; or at 85° C., less than or equal to $1\times10^{-15}$ A, preferably $1\times10^{-18}$ A, more preferably less than or equal to $1\times10^{-21}$ A. An off state of a transistor refers to a state where a gate voltage is much lower than the threshold voltage in an n-channel transistor. Specifically, when the gate voltage is lower than the threshold voltage by 1 V or more, 2 V or more, or 3 V or more, the transistor is off.

An oxide semiconductor which is formed may include a non-single-crystal, for example. The non-single-crystal is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS sometimes includes a plurality of crystal parts in which c-axes are aligned in a direction parallel to a normal vector of a surface where the CAAC-OS is formed or a normal vector of a surface of the CAAC-OS. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are observed in an electron diffraction pattern of the CAAC-OS in some cases. An electron diffraction pattern obtained with an electron beam having a beam diameter of 10 nm or smaller, or 5 nm or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. Charges trapped by the trap states in the oxide semiconductor take a long time to be released and may behave like fixed charges. Thus, the transistor which includes the oxide semiconductor having a high density of trap states in the channel formation region has unstable electrical characteristics in some cases.

A transistor including the highly purified intrinsic or substantially highly purified intrinsic CAAC-OS has a small variation in the electrical characteristics due to irradiation with visible light or ultraviolet light.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak which shows alignment does not appear in some cases. Further, for example, a halo pattern is shown in some cases in an electron diffraction pattern of the nc-OS obtained by using an electron beam having a beam diameter larger than the diameter of a crystal part (e.g., a beam diameter of 20 nmϕ or more, or 50 nmϕ or more). For example, spots are shown in some cases in a nanobeam electron diffraction pattern of the nc-OS obtained by using an electron beam having a beam diameter smaller than or equal to the diameter of a crystal part (e.g., a beam diameter of 10 nmϕ or less, or 5 nmϕ or less). In a nanobeam electron diffraction pattern of the nc-OS, for example, regions with high luminance in a circular pattern are shown in some cases. In a nanobeam electron diffraction pattern of the nc-OS, for example, a plurality of spots is shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

This embodiment can be implemented in appropriate combination with any of the other embodiments and the like.

Embodiment 4

In this embodiment, a cross-sectional structure of transistors included in the signal generation device 40 according to one embodiment of the disclosed invention is described with reference to a drawing.

Note that as the transistor included in the signal generation device, it is possible to use the OS transistor in the voltage hold portion 100 of the semiconductor device 10 or the Si transistor in circuits of the bias voltage generation portion 20 and the signal output portion 30.

Figure 11:
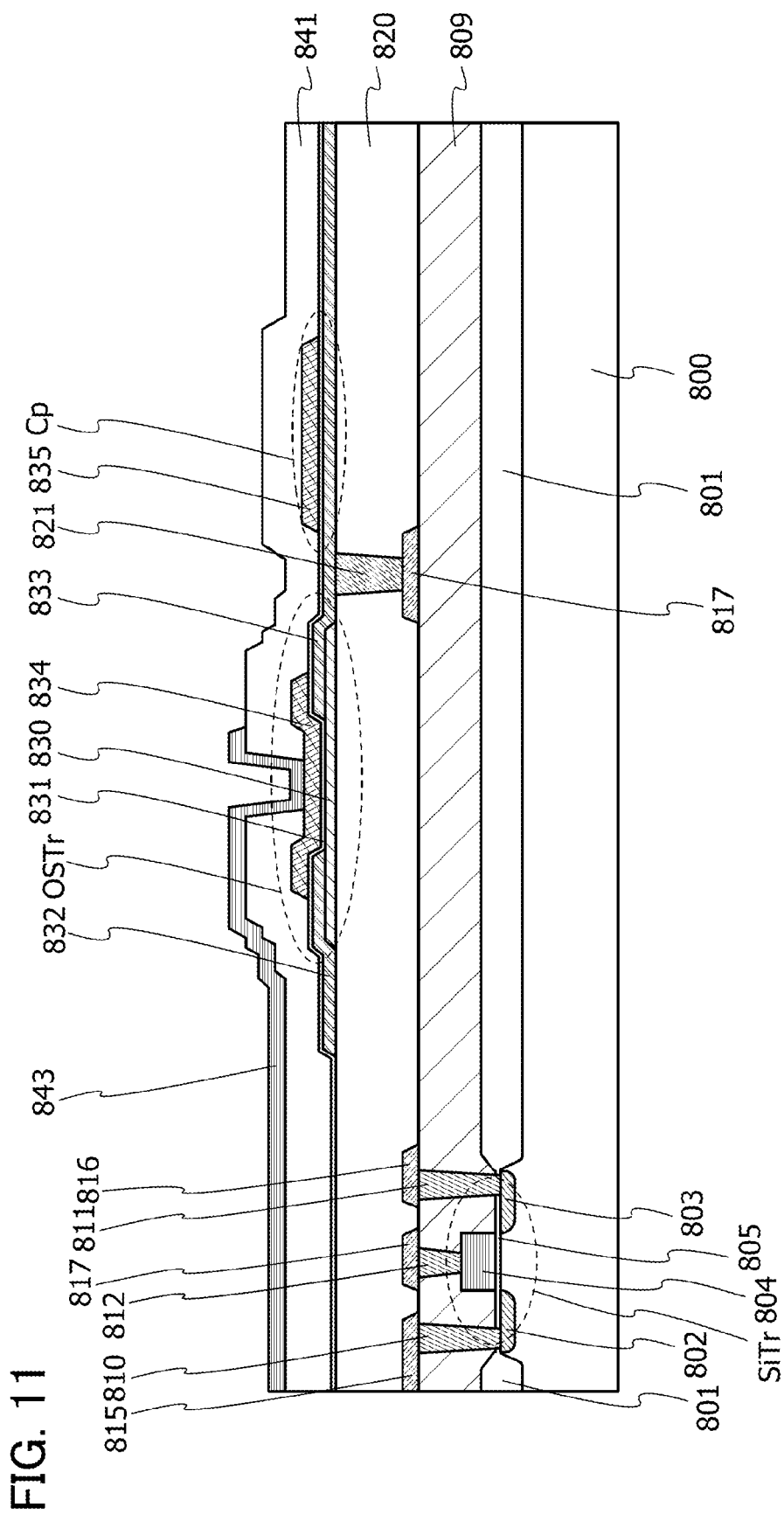
FIG. 11 is a cross-sectional view according to one embodiment of the present invention.

This embodiment specifically describes an example of a cross-sectional structure where an OS transistor and a capacitor that form the potential hold portion 100 of the semiconductor device 10 and an Si transistor are stacked, with reference to the drawing. FIG. 11 shows the cross-sectional structure of a transistor SiTr, a transistor OSTr, and a capacitor Cp as the Si transistor, the OS transistor, and the capacitor, respectively.

In this embodiment, the transistor SiTr is formed in a single crystal silicon substrate, and the transistor OSTr including an oxide semiconductor layer is formed over the transistor SiTr. The transistor SiTr may include a thin semiconductor layer of silicon, germanium, or the like in an amorphous, microcrystalline, polycrystalline, or single crystal state.

In the case where the transistor SiTr is formed using a thin silicon film, any of the following can be used: amorphous silicon formed by a sputtering method or a vapor phase growth method such as a plasma CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Note that in the semiconductor device 10 described in Embodiment 2, the number of the OS transistors is smaller than the number of the Si transistors. Thus, a stack of the transistor OSTr over the transistor SiTr leads to more flexible design rule of the transistor OSTr.

With the above-described structure in which the Si transistor and the OS transistor are stacked, the chip area of the semiconductor device 10 can be reduced. Because the number of the Si transistors is larger than the number of the OS transistors in one circuit block, an actual chip area depends on the number of the Si transistors.

In FIG. 11, the n-channel transistor SiTr is formed in a semiconductor substrate 800.

The semiconductor substrate 800 can be, for example, a silicon substrate having n-type or p-type conductivity, a germanium substrate, a silicon germanium substrate, a compound semiconductor substrate (e.g., a GaAs substrate, an InP substrate, a GaN substrate, a SiC substrate, a GaP substrate, a GaInAsP substrate, or a ZnSe substrate), or the like.

The transistor SiTr is electrically isolated from the other transistors by an element isolation insulating film 801. The element isolation insulating film 801 can be formed by a local oxidation of silicon (LOCOS) method, a trench isolation method, or the like.

Specifically, the transistor SiTr includes impurity regions 802 and 803 that are formed in the semiconductor substrate 800 and function as a source region and a drain region, a gate electrode 804, and a gate insulating film 805 provided between the semiconductor substrate 800 and the gate electrode 804. The gate electrode 804 overlaps with a channel formation region formed between the impurity regions 802 and 803 with the gate insulating film 805 positioned between the gate electrode 804 and the channel formation region.

An insulating film 809 is provided over the transistor SiTr. Openings are formed in the insulating film 809. Wirings 810 and 811 that are in contact with the impurity regions 802 and 803, respectively, and a wiring 812 that is in contact with the gate electrode 804 is formed in the openings.

The wiring 810 is connected to a wiring 815 formed over the insulating film 809. The wiring 811 is connected to a wiring 816 formed over the insulating film 809. The wiring 812 is connected to a wiring 817 formed over the insulating film 809.

An insulating film 820 is formed over the wirings 815 to 817. An opening is formed in the insulating film 820. In the opening, a wiring 821 that is connected to the wiring 817 is formed.

In FIG. 11, the transistor OSTr and the capacitor Cp are formed over the insulating film 820.

The transistor OSTr includes, over the insulating film 820, a semiconductor film 830 including an oxide semiconductor, conductive films 832 and 833 that are positioned over the semiconductor film 830 and function as a source electrode and a drain electrode, a gate insulating film 831 over the semiconductor film 830 and the conductive films 832 and 833, and a gate electrode 834 that is positioned over the gate insulating film 831 and overlaps with the semiconductor film 830 between the conductive films 832 and 833. Note that the conductive film 833 is connected to the wiring 821.

A conductive film 835 is provided over the gate insulating film 831 to overlap with the conductive film 833. A portion where the conductive film 835 overlaps with the conductive film 833 with the gate insulating film 831 placed therebetween functions as the capacitor Cp.

Note that in FIG. 11, the capacitor Cp is provided over the insulating film 820 together with the transistor OSTr. However, the capacitor Cp may be provided below the insulating film 820 together with the transistor SiTr.

An insulating film 841 is provided over the transistor OSTr and the capacitor Cp. An opening is provided in the insulating film 841. Over the insulating film 841, a conductive film 843 that is in contact with the gate electrode 834 through the opening is provided.

Note that in FIG. 11, the transistor OSTr includes the gate electrode 834 on at least one side of the semiconductor film 830. Alternatively, the transistor OSTr may include a pair of gate electrodes with the semiconductor film 830 positioned therebetween.

When the transistor OSTr includes a pair of gate electrodes with the semiconductor film 830 positioned therebetween, a signal for controlling on/off may be supplied to one of the gate electrodes, and the other of the gate electrodes may be supplied with a potential from another element. In the latter case, potentials with the same level may be supplied to the pair of electrodes, or a fixed potential such as a ground potential may be supplied only to the other of the gate electrodes. When the level of a potential supplied to the other of the gate electrodes is controlled, the threshold voltage of the transistor OSTr can be controlled.

The semiconductor film 830 is not limited to a single oxide semiconductor film and may have a structure including a plurality of oxide semiconductor films which are stacked.

This embodiment can be combined with any of the other embodiments as appropriate.

Embodiment 5

In this embodiment, examples of electronic devices each including the signal generation device described in any of the above embodiments are described. Examples of the electronic devices include computers, portable information terminals (including mobile phones, portable game machines, audio reproducing devices, and the like), electronic paper, television devices (also referred to as televisions or television receivers), and digital video cameras.

Figure 12A:
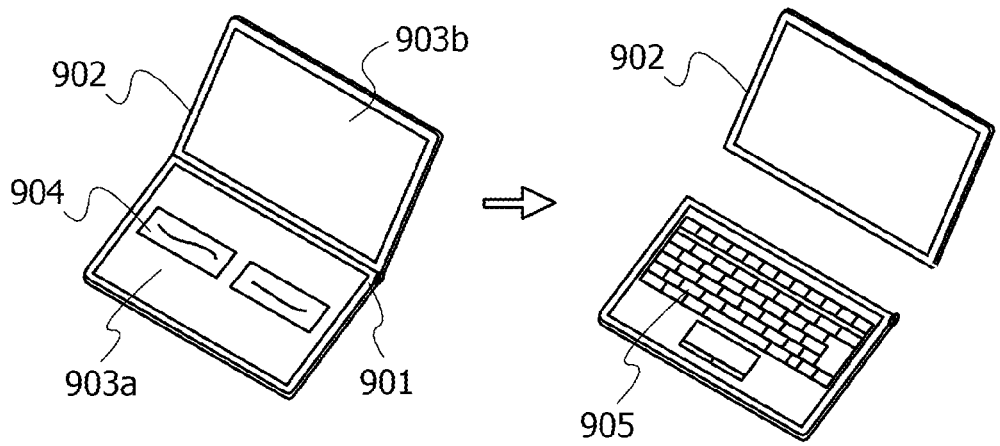
FIGS. 12A to 12E illustrate electronic devices each including a signal generation device.

FIG. 12A illustrates a portable information terminal, which includes a housing 901, a housing 902, a first display portion 903a, a second display portion 903b, and the like. The signal generation device described in any of the above embodiments is provided in at least one of the housings 901 and 902. Thus, it is possible to obtain the portable information terminal including the signal generation device excellent in sampling and holding the bias voltage and can operate without a reduction in performance even when the supply of power to part of a circuit is stopped.

Note that the first display portion 903a is a touch panel, and for example, as illustrated in the left of FIG. 12A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 12A. With such a structure, letters can be input quickly by keyboard input as in the case of using a conventional information terminal, for example.

Further, one of the first display portion 903a and the second display portion 903b can be detached from the portable information terminal as illustrated in the right of FIG. 12A. The second display portion 903b can also function as a touch panel for a reduction in weight to carry around to be operated by one hand while the other hand supports the housing 902, which is convenient.

The portable information terminal illustrated in FIG. 12A can have a function of displaying a variety of information (e.g., a still image, a moving image, and a text image) on the display portion, a function of displaying a calendar, a date, the time, or the like on the display portion, a function of operating or editing information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 12A may transmit and receive data wirelessly. Through wireless communication, desired book data or the like can be purchased and downloaded from an e-book server.

Further, the housing 902 illustrated in FIG. 12A may have an antenna, a microphone function, or a wireless communication function to be used as a cellular phone.

Figure 12B:
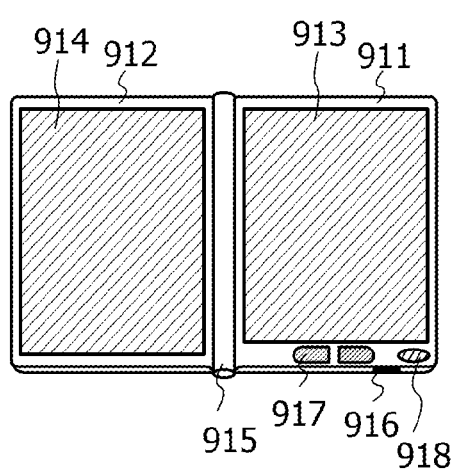

FIG. 12B illustrates an electronic book reader in which electronic paper is incorporated. The electronic book reader has two housings of a housing 911 and a housing 912. The housing 911 and the housing 912 are provided with a display portion 913 and a display portion 914, respectively. The housings 911 and 912 are connected by a hinge portion 915 and can be opened or closed with the hinge portion 915 as an axis. The housing 911 is provided with a power switch 916, an operation key 917, a speaker 918, and the like. At least one of the housing 911 and the housing 912 is provided with the signal generation device described in any of the above embodiments. Thus, it is possible to obtain the electronic book reader including the signal generation device excellent in sampling and holding the bias voltage and can operate without a reduction in performance even when the supply of power to part of a circuit is stopped.

Figure 12C:
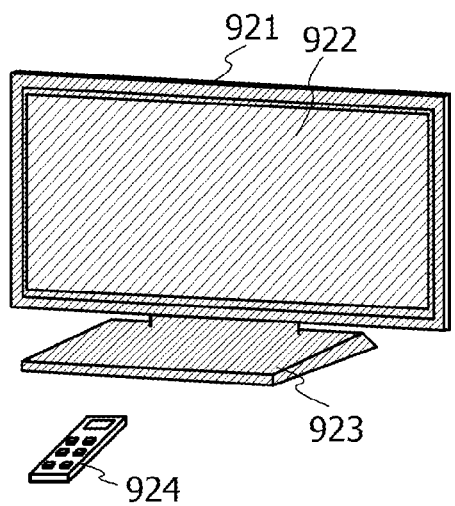

FIG. 12C is a television device, which includes a housing 921, a display portion 922, a stand 923, and the like. The television device can be operated with a switch of the housing 921 and a separate remote controller 924. The signal generation device described in any of the above embodiments is provided in the housing 921 and the remote controller 924. Thus, it is possible to obtain the television device including the signal generation device excellent in sampling and holding the bias voltage and can operate without a reduction in performance even when the supply of power to part of a circuit is stopped.

Figure 12D:
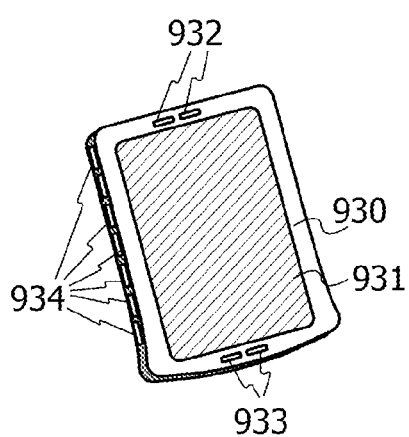

FIG. 12D illustrates a smartphone in which a main body 930 includes a display portion 931, a speaker 932, a microphone 933, operation buttons 934, and the like. The signal generation device described in any of the above embodiments is provided in the main body 930. Thus, it is possible to obtain the smartphone including the signal generation device excellent in sampling and holding the bias voltage and can operate without a reduction in performance even when the supply of power to part of a circuit is stopped.

Figure 12E:

FIG. 12E is a wrist watch type display device including a main body 941, a display portion 942, and the like. The signal generation device described in any of the above embodiments is provided in the main body 941. Thus, it is possible to obtain the wrist watch type display device including the signal generation device excellent in sampling and holding the bias voltage and can operate without a reduction in performance even when the supply of power to part of a circuit is stopped.

As described above, the signal generation device described in any of the above embodiments is provided for each of the electronic devices described in this embodiment. Thus, it is possible to obtain the electronic device including the signal generation device excellent in sampling and holding the bias voltage and can operate without a reduction in performance even when the supply of power to part of a circuit is stopped.

This application is based on Japanese Patent Application serial no. 2013-158417 filed with Japan Patent Office on Jul. 31, 2013, the entire contents of which are hereby incorporated by reference.

What is claimed is:

1. A semiconductor device comprising:
a first transistor;
a second transistor;
a third transistor;
a fourth transistor; and
a first capacitor,
wherein a gate of the first transistor is electrically connected to a first electrode of the first capacitor,
wherein one of a source and a drain of the second transistor is electrically connected to the gate of the first transistor,
wherein one of a source and a drain of the third transistor is electrically connected to the gate of the first transistor,
wherein a gate of the second transistor is electrically connected to one of a source and a drain of the first transistor,
wherein the second transistor and the fourth transistor are electrically connected in series, and
wherein a gate of the third transistor is directly connected to a gate of the fourth transistor.

2. The semiconductor device according to claim 1,
wherein the one of the source and the drain of the second transistor is electrically connected to the gate of the first transistor via the fourth transistor.

3. The semiconductor device according to claim 1, further comprising a second capacitor electrically connected to the other of the source and the drain of the first transistor.

4. The semiconductor device according to claim 1,
wherein a second electrode of the first capacitor is selectively supplied with a first potential and a second potential higher than the first potential.

5. The semiconductor device according to claim 1,
wherein each of the first transistor, the second transistor and the third transistor comprises a channel formation region comprising an oxide semiconductor, and
wherein the fourth transistor comprises a channel formation region comprising silicon.

6. A semiconductor device comprising:
a first transistor;
a second transistor;
a third transistor;
a fourth transistor; and
a first capacitor,
wherein a gate of the first transistor is electrically connected to a first electrode of the first capacitor,
wherein one of a source and a drain of the second transistor is electrically connected to the gate of the first transistor,
wherein one of a source and a drain of the third transistor is electrically connected to the gate of the first transistor,
wherein one of a source and a drain of the fourth transistor is electrically connected to the other of the source and the drain of the second transistor, and
wherein a gate of the second transistor is directly connected to one of a source and a drain of the first transistor.

7. The semiconductor device according to claim 6,
wherein a gate of the third transistor is electrically connected to a gate of the fourth transistor.

8. The semiconductor device according to claim 6, further comprising a second capacitor electrically connected to the other of the source and the drain of the first transistor.

9. The semiconductor device according to claim 6,
wherein a second electrode of the first capacitor is selectively supplied with a first potential and a second potential higher than the first potential.

10. The semiconductor device according to claim 6,
wherein each of the first transistor, the second transistor and the third transistor comprises a channel formation region comprising an oxide semiconductor, and
wherein the fourth transistor comprises a channel formation region comprising silicon.

11. The semiconductor device according to claim 10,
wherein an insulating film is over the fourth transistor, and
wherein each of the first transistor, the second transistor and the third transistor is over the insulating film.

12. The semiconductor device according to claim 6,
wherein each of the first transistor, the second transistor, the third transistor and the fourth transistor comprises a channel formation region comprising an oxide semiconductor.

13. A semiconductor device comprising:
a first transistor;
a second transistor;
a third transistor;
a fourth transistor; and
a first capacitor,
wherein a gate of the first transistor is electrically connected to a first electrode of the first capacitor,
wherein one of a source and a drain of the second transistor is electrically connected to the gate of the first transistor,
wherein one of a source and a drain of the third transistor is electrically connected to the gate of the first transistor,
wherein one of a source and a drain of the fourth transistor is electrically connected to the other of the source and the drain of the second transistor, and
wherein a gate of the fourth transistor is directly connected to one of a source and a drain of the first transistor.

14. The semiconductor device according to claim 13,
wherein a gate of the second transistor is electrically connected to a gate of the third transistor.

15. The semiconductor device according to claim 13, further comprising a second capacitor electrically connected to the other of the source and the drain of the first transistor.

16. The semiconductor device according to claim 13,
wherein a second electrode of the first capacitor is selectively supplied with a first potential and a second potential higher than the first potential.

17. The semiconductor device according to claim 13,
wherein each of the first transistor, the third transistor and the fourth transistor comprises a channel formation region comprising an oxide semiconductor, and
wherein the second transistor comprises a channel formation region comprising silicon.

18. The semiconductor device according to claim 17,
wherein an insulating film is over the second transistor, and
wherein each of the first transistor, the third transistor and the fourth transistor is over the insulating film.

19. The semiconductor device according to claim 13,
wherein each of the first transistor, the second transistor, the third transistor and the fourth transistor comprises a channel formation region comprising an oxide semiconductor.

* * * * *